US 12,418,999 B1

(12) United States Patent
Ahn et al.

(10) Patent No.: US 12,418,999 B1
(45) Date of Patent: Sep. 16, 2025

(54) DISPLAY DEVICE

(71) Applicant: LG ELECTRONICS INC., Seoul (KR)

(72) Inventors: Minsoo Ahn, Seoul (KR); Kitae Kang, Seoul (KR); Dohyeon Kim, Seoul (KR); Byoungjoon Lee, Seoul (KR); Jungho Kim, Seoul (KR); Jeongmo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/905,720

(22) Filed: Oct. 3, 2024

(30) Foreign Application Priority Data

May 24, 2024 (WO) ................ PCT/KR2024/007105

(51) Int. Cl.
G09F 7/20 (2006.01)
G09F 7/18 (2006.01)
G09F 9/302 (2006.01)
H05K 5/02 (2006.01)

(52) U.S. Cl.
CPC ............. H05K 5/0217 (2013.01); G09F 7/20 (2013.01); G09F 9/3023 (2013.01); G09F 9/3026 (2013.01)

(58) Field of Classification Search
CPC ............... G09F 9/3026; G09F 13/0445; G09F 2007/1856; G09F 7/20
See application file for complete search history.

(56) References Cited

U.S. PATENT DOCUMENTS

| 7,593,239 B2* | 9/2009 | Li | H05K 7/142 361/803 |
| 8,405,960 B2* | 3/2013 | Ishizu | F16M 13/02 361/679.01 |
| 11,006,534 B2* | 5/2021 | Kim | H05K 5/30 |
| 11,645,955 B2* | 5/2023 | Lee | G09F 9/3026 345/1.3 |

(Continued)

FOREIGN PATENT DOCUMENTS

| KR | 10-2012-0066344 | 6/2012 |
| KR | 10-2020-0072789 | 6/2020 |

(Continued)

OTHER PUBLICATIONS

PCT International Application No. PCT/KR2024/007105, Written Opinion of the International Searching Authority dated Feb. 15, 2025, 8 pages.

Primary Examiner — Shin H Kim
(74) Attorney, Agent, or Firm — LEE, HONG, DEGERMAN, KANG & WAIMEY

(57) ABSTRACT

Disclosed is a display device including a display module, a frame located in rear of the display module, a step difference adjusting unit located between the display module and the frame to adjust a distance between the display module and the frame, a worm shaft providing a driving force to the step difference adjusting unit, and a controller controlling the display module to output a marker at a position related to the step difference adjusting unit. Accordingly, it is possible to adjust a height or level difference between the display modules disposed adjacent to each other without separation of the display modules, thereby shortening the installation time.

15 Claims, 15 Drawing Sheets

(56) References Cited

U.S. PATENT DOCUMENTS

| | | | |
|---|---|---|---|
| 11,990,063 B1* | 5/2024 | Richards | G09F 9/33 |
| 12,027,079 B2* | 7/2024 | Yang | G09F 9/3026 |
| 2017/0033154 A1* | 2/2017 | Lan | H10H 20/857 |
| 2019/0179592 A1* | 6/2019 | Hyeon | G09G 3/006 |
| 2019/0277377 A1* | 9/2019 | Heo | G09F 9/33 |
| 2020/0057594 A1* | 2/2020 | Nakano | G09F 9/3026 |
| 2020/0064677 A1* | 2/2020 | Yoon | H01R 13/6205 |
| 2020/0103068 A1* | 4/2020 | Ahn | F16M 11/043 |
| 2020/0380895 A1* | 12/2020 | Nakano | F16M 11/043 |
| 2020/0389987 A1 | 12/2020 | Kanno et al. | |
| 2021/0157371 A1* | 5/2021 | Mori | G09F 9/3026 |
| 2021/0311684 A1* | 10/2021 | Nussbaumer | F16M 11/18 |
| 2023/0052729 A1* | 2/2023 | Yang | G09F 9/3023 |

FOREIGN PATENT DOCUMENTS

| | | |
|---|---|---|
| KR | 10-2022-0049082 | 4/2022 |
| KR | 10-2023-0024110 | 2/2023 |

* cited by examiner

DISPLAY DEVICE

CROSS-REFERENCE TO RELATED APPLICATION

Pursuant to 35 U.S.C. § 119, this application claims the benefit of an earlier filing date and right of priority to International Application No. PCT/KR2024/007105, filed on May 24, 2024, the contents of which are hereby incorporated by reference herein in its entirety.

BACKGROUND OF THE DISCLOSURE

Field of the Disclosure

The present embodiments relate to a display device including a plurality of display modules.

Discussion of the Related Art

Digital signage is a communication tool that can induce marketing, advertising, training effects and customer experience of companies. It is a display device that provides specific information as well as broadcast programs in public places such as airports, hotels, hospitals, and subway stations.

The digital signage is a medium that displays various content and commercial advertisements by installing display devices such as a liquid crystal display (LCD), a plasma display panel (PDP), and an organic light emitting diode (OLED) in outdoor certain places or street furniture. The digital signage can now be installed on all moving lines, where the public moves, such as apartment elevators, subway stations, subways, buses, universities, banks, convenience stores, discount stores, shopping malls.

When configuring a single screen using a plurality of display modules, it is important to configure a front position between neighboring display modules equally because there is a problem that a screen is divided or distorted due to a step difference between neighboring display modules in a vertical or horizontal direction.

Typically, when there is a step difference between neighboring display modules, the display modules are separated, a height of a coupling part is adjusted, and then the display modules are coupled together again. This method has a problem of poor accuracy because the display modules should be repeatedly coupled and separated and adjusted while the display modules are separated.

SUMMARY OF THE DISCLOSURE

One object of the present disclosure is to solve the above-mentioned problems and other problems. Another object of the present disclosure may be to provide a multi-display device capable of adjusting a height difference or a level difference between adjacent display modules.

To achieve these objects and other advantages and in accordance with the purpose of the disclosure, as embodied and broadly described herein, a display device according to the present disclosure may include a display module, a frame located in rear of the display module, a step difference adjusting unit located between the display module and the frame to adjust a distance between the display module and the frame, a worm shaft providing a driving force to the step difference adjusting unit, and a controller controlling the display module to output a marker at a position related to the step difference adjusting unit.

The controller may control the display module to output only the marker related to the step difference adjusting unit requiring step difference adjustment.

The controller may control the display module not to output the marker related to the step difference adjusting unit having completed step difference adjustment.

The display device may further include a displacement sensor measuring a step difference between the display modules adjacent to each other, and the controller may output a value measured by the displacement sensor to the display module.

The step difference adjusting unit may include a holder magnet having the display module coupled to a rear surface thereof, a leveling screw extending in a rear surface direction from the holder magnet to adjust an amount of insertion into the frame, a clutch module selectively providing the driving force of the worm shaft to the leveling screw, and a magnet jig coming in contact with the marker to switch the clutch module to an ON state.

The display device may further include a nut gear allowing the leveling screw to pass therethrough, wherein the clutch module moves the leveling screw in front-rear direction by rotating the nut gear in an ON state of the clutch module.

The display device may include a worm wheel rotating by engaging with the worm shaft, a clutch gear selectively coupled to the worm wheel to transmit a driving force of the worm wheel to the leveling screw, a clutch shaft passing through the clutch gear, and a clutch head located on a front surface of the clutch shaft, and the display module may output the marker in front of the clutch head.

Based on moving the clutch head by a magnetic force of the magnet jig, the clutch gear may be coupled to the worm wheel.

The magnet jig may include an electromagnet selectively providing a magnetic force, and a power is turned off based on ending control of the step difference adjusting unit.

A plurality of the step difference adjusting units may be disposed in a longitudinal direction of the worm shaft in a manner of being spaced apart from each other and the worm shaft may be disposed to engage with a worm wheel of each of a plurality of the step difference adjusting units.

In another aspect, as embodied and broadly described herein, a method of installing a display device according to the present disclosure may include installing a plurality of display modules in a frame, detecting a step difference between the display modules adjacent to each other, outputting a marker related to a position of a step difference adjusting module to the display module, contacting a magnet jig with the marker, adjusting a forward-backward position of the display module by rotating the worm shaft to control the step difference adjusting module, and separating the magnet jig from the marker.

According to an embodiment of the present disclosure, it is possible to adjust a height or level difference between adjacent display modules without separation of the display modules, thereby shortening the installation time.

In addition, according to an embodiment of the present disclosure, it is possible to prevent an accident in which a display module is damaged in a process of repeating attachment and detachment.

Additional scope of applicability of the present disclosure will become apparent from the following detailed description. However, since various changes and modifications within the spirit and scope of the present disclosure can be understood by those skilled in the art, it should be understood that specific embodiments, such as the detailed

DETAILED DESCRIPTION OF THE DISCLOSURE

Figure 1:
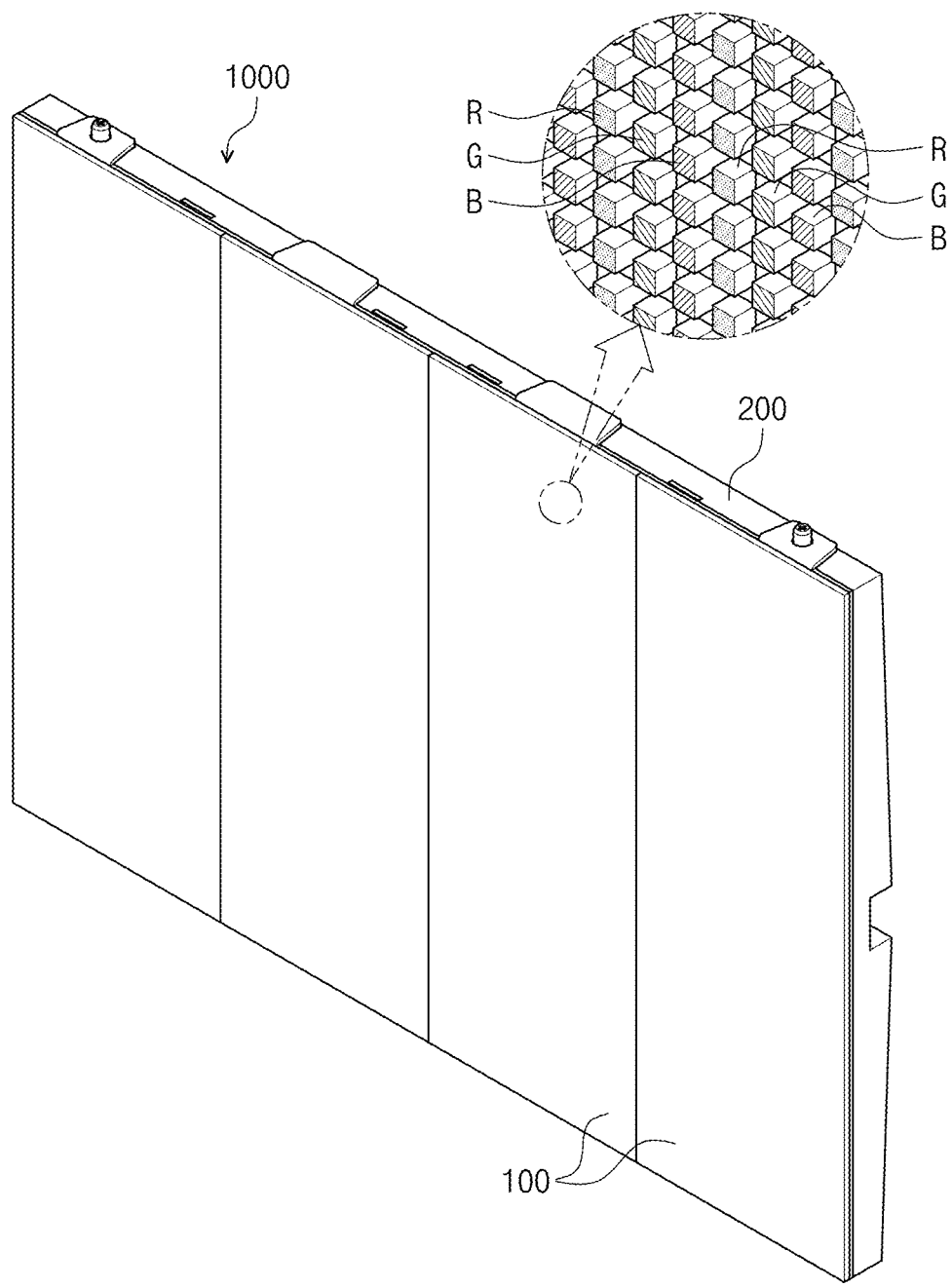
FIG. 1 is a diagram illustrating a display device according to an embodiment of the present disclosure.

Reference will now be made in detail embodiments of the present disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Hereinafter, the embodiments of the present disclosure are described using a Light Emitting Diode (LED) panel as an example of a display panel. Other display panels may be used. For example, an organic light emitting diode (OLED) display panel, a plasma display panel (PDP), a field emission display (FED) panel, Liquid Crystal Display (LCD) and may be used.

Figure 2:
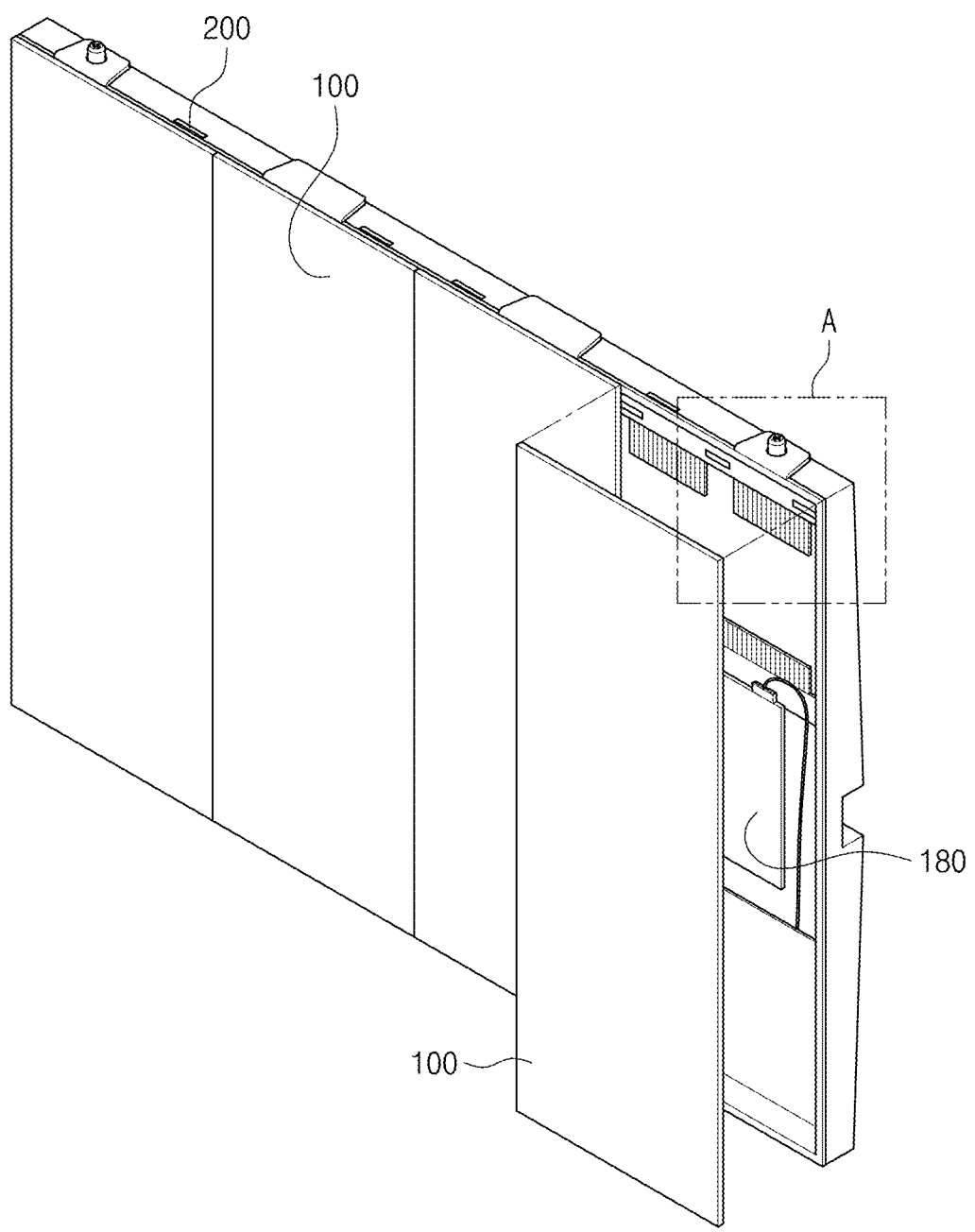
FIG. 2 is a diagram illustrating a process of assembling a display module of a display device according to an embodiment of the present disclosure.

FIG. 1 is a diagram illustrating a display device 1000 according to an embodiment of the present disclosure, and FIG. 2 is a diagram illustrating a process of assembling a display module of a display device 1000 according to an embodiment of the present disclosure.

Referring to FIG. 1 and FIG. 2, a multi-display device 1000 may include a display module 100 capable of displaying an image, a frame 200 supporting the display module 100, and a step difference adjusting unit 250 mounted between the display module 100 and the frame 200 to adjust a distance between them.

The display module 100 may include a display panel and a module cover positioned in rear of the display panel. The module cover may be disposed in rear of the display panel to protect a rear surface of the display panel from the outside, and may include a coupling part attached to a displacement adjusting unit to be attached to the frame.

The display panel 101 may include a plurality of pixels R, G, B. The plurality of pixels R, G, and B may be formed in each region where a plurality of data lines and a plurality of gate lines cross. The plurality of pixels R, G, B may be disposed or arranged in a matrix form.

For example, the plurality of pixels R, G, and B may include a red (R) sub-pixel, a green (G) sub-pixel, and a blue (B) sub-pixel. The plurality of pixels R, G, and B may further include a white (hereinafter, 'W') sub-pixel.

In the display panel 101, a side on which images can be observed may be referred to as a front side or a front surface. When the display panel 101 displays the images, a side on which the images cannot be observed may be referred to as a back side or a back surface. When looking at the display panel 101 from the front side or the front surface, an upper part may be referred to as an upper side or an upper surface. Similarly, a lower part may be referred to as a lower side or a lower surface. Similarly, a right part may be referred to as a right side or a right surface, and a left part may be referred to as a left side or a left surface.

Regarding the display module 100, a plurality of display modules 100 may be arranged in a manner of neighboring each other in an up-and-down direction or a left-and-right direction. The display module 100 of the present embodiment may have a long length in a vertical direction and a plurality of the display modules 100 arranged side by side in a horizontal direction.

The frame 200 may be disposed behind the plurality of display modules 100. A front surface of the frame 200 may face the back surface of the display module 100. The frame 200 may be disposed to correspond to the display module 100 in a thickness direction or a back-and-forth direction of the display module 100. The frame 200 may be formed in a frame shape in which a central region is opened.

The frame 200 may be formed to be long in the up-down direction and the left-right direction so that the plurality of display modules 100 may be mounted. For example, a length of an upper side of the frame 200 may be substantially the same as a sum of a length of the upper side of the first display module 100a and a length of the upper side of the fourth display module 100d. A length of a right side of the frame 200 may be substantially the same as a sum of a length of the right side of the first display module 100a, a length of the right side of the second display module 100b, and a length of the right side of the third display module 100c. But, it is not limited thereto. The frame 200 may be formed to be longer or shorter than the display module 100 according to an external environment such as a building or a wall to be installed.

Although FIG. 1 and FIG. 2 illustrate that a single frame 200 is formed, the present disclosure is not limited thereto. A plurality of frames 200 may be included in a size corresponding to a size of the display module.

Figure 3:
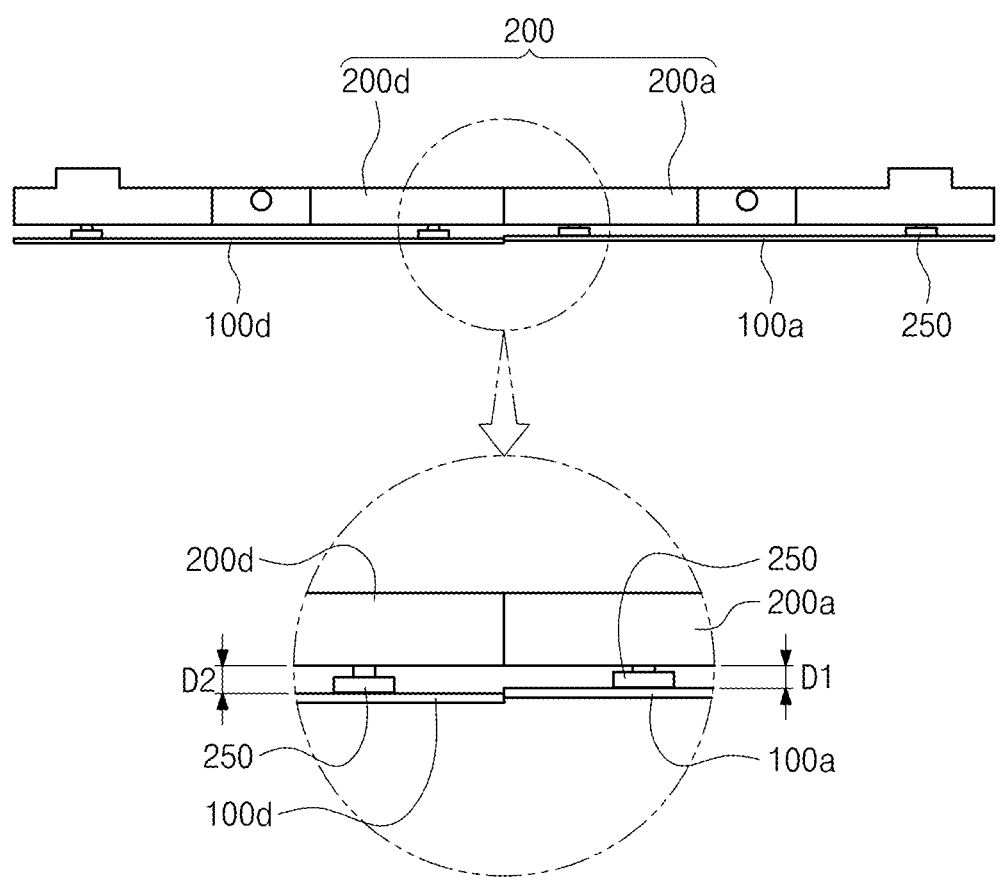
FIG. 3 is a diagram illustrating a step difference between display modules of a display device according to an embodiment of the present disclosure.

FIG. 3 is a diagram illustrating a step difference between display modules of a display device 1000 according to an embodiment of the present disclosure. Neighboring display modules may differ from each other in thicknesses, and may have different thicknesses in a process of assembling a frame. Alternatively, a height difference on a wall for installation may occur, and thus a step difference may occur between the display modules as illustrated in FIG. 3.

A step difference adjusting unit 250 for adjusting a distance between the display module 100 and the frame 200 is required to adjust a step difference between neighboring display modules.

The step difference adjusting unit 250 may be disposed between a plurality of display modules 100 and the frame 200. The step difference adjusting unit 250 may be mounted on the frame 200 in a thickness direction of the display module 100. The step difference adjusting unit 250 mounted on a front surface of the frame 200 may be attached to a rear surface of the display module 100.

The step difference adjusting unit 250 may adjust a spaced distance between the rear surface of the display module 100 and the front surface of the frame 200. There may be a plurality of step difference adjusting units 250. Each of the step difference adjusting units 250 may be disposed at an end portion of the frame 200.

The step difference adjusting unit 250 minutely adjusts an amount of protrusion from the frame 200 to adjust a distance between the frame 200 and the display module 100. However, according to the related art method, since the step difference adjusting unit 250 is located on a rear surface of the display module 100, the display module 100 must be separated from the frame 200 to control the step difference adjusting unit 250. In the related art method, the adjustment of the step difference adjusting unit 250 is cumbersome and it is difficult to accurately grasp a step difference between neighboring display modules 100.

Accordingly, the present disclosure provides the display device 1000 capable of adjusting the step difference adjusting unit 250 while the display module 100 is coupled to the frame 200.

Figure 4:
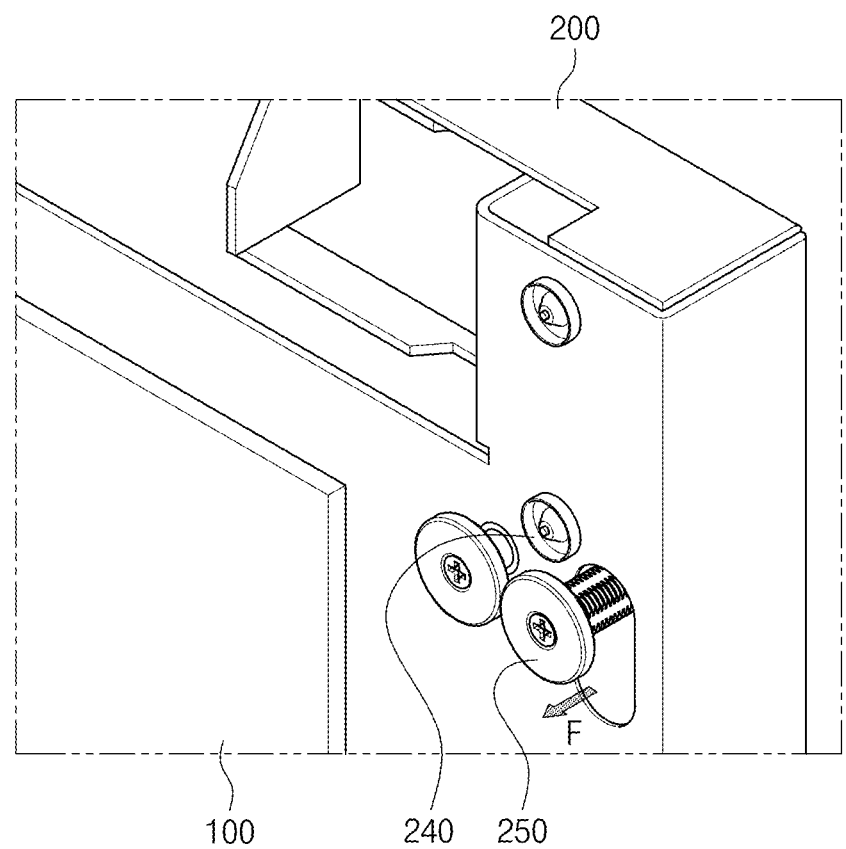
FIG. 4 is an enlarged diagram showing a portion A of FIG. 2.

FIG. 4 is an enlarged diagram illustrating a portion A of FIG. 2, in which the step difference adjusting unit 250 is illustrated. The step difference adjusting unit 250 of the present disclosure is located on the frame 200 and may be located on a rear surface of an end portion of the display module 100. The step difference adjusting unit 250 may include a holder magnet 258 coupled to the display module 100. The holder magnet 258 is projected forward from the frame 200 and is coupled to the frame 200 through a leveling screw 257.

A projected amount of the holder magnet 258 may be adjusted by rotating the leveling screw 257 or by rotating a nut gear 256 into which the leveling screw 257 is inserted. In the related art, an amount of insertion into the frame 200 of the leveling screw 257 is adjusted by removing the display module 100 and rotating the holder magnet 258, but in the present disclosure, the nut gear 256 into which the leveling screw 257 is inserted may be rotated using a worm shaft 260 extending in a direction vertical to the leveling screw 257 to adjust a position of the leveling screw 257 in the forward and backward directions.

Figure 5:
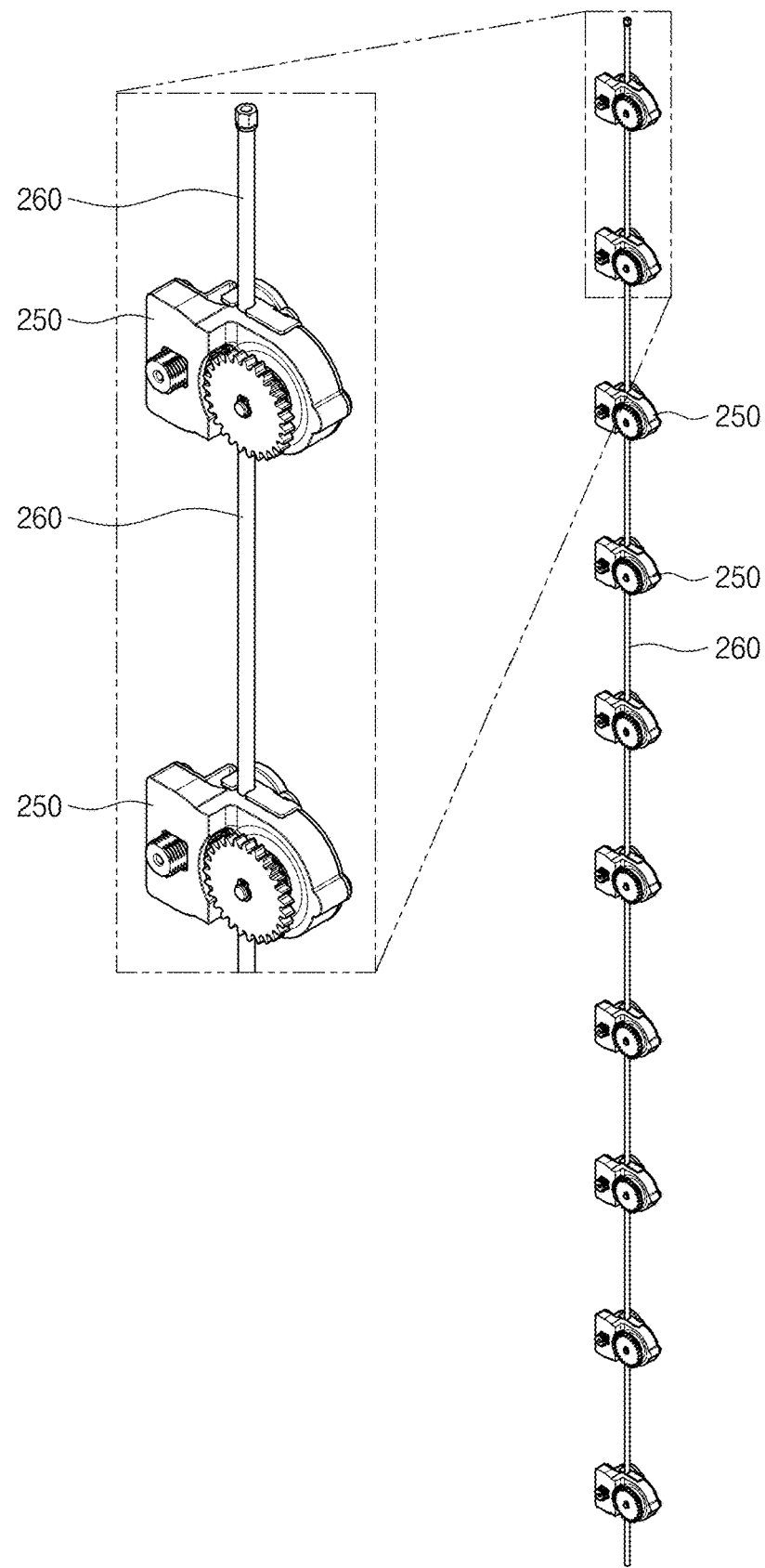
FIG. 5 is a diagram illustrating a step difference adjusting unit of a display device according to an embodiment of the present disclosure.

FIG. 5 is a diagram illustrating the step difference adjusting unit 250 of the display device 1000 according to an embodiment of the present disclosure. The step difference adjusting unit 250 may be disposed to be spaced apart from each other by a predetermined distance along an end portion of the display module 100.

The worm shaft 260 may be coupled to each step difference adjusting unit 250 one by one, but it is difficult for a user to directly adjust the worm shaft 260 except for an end portion of the display module 100. Accordingly, as shown in FIG. 5, a worm shaft 260 extended to be simultaneously coupled to a plurality of the step difference adjusting units 250 may be used.

A motor 265 (see FIG. 12) for rotating the worm shaft 260 is provided at the end portion of the worm shaft 260 extending to the end portion of the display module 100, or a user may manually rotate to adjust the projected amount of the leveling screw 257 of the step difference adjusting unit 250.

However, in order to individually control only the specific step difference adjusting unit 250 by using the worm shaft 260 coupled to a plurality of the step difference adjusting units 250, a selective synchronization structure for selectively synchronizing the worm shaft 260 with the leveling screw 257 is required. Hereinafter, the selective synchronization structure is referred to as a clutch module 251, 252, 253, 254, and 255.

The step difference adjusting unit 250 includes a worm wheel 255 that rotates in engagement with the worm shaft 260, and the clutch module may selectively transmit a rotational force of the worm wheel 255, which rotates when the worm shaft 260 rotates, to the nut gear 256 into which the leveling screw 257 is inserted.

A state in which the clutch module transmits the rotational force of the worm wheel 255, which rotates when the worm shaft 260 rotates, to drive the step difference adjusting unit 250 is called an ON state. A state in which the rotational force of the worm wheel 255 cannot be transmitted to the leveling screw 257 is called an OFF state because the clutch module is not synchronized with the worm shaft 260.

Figure 6:
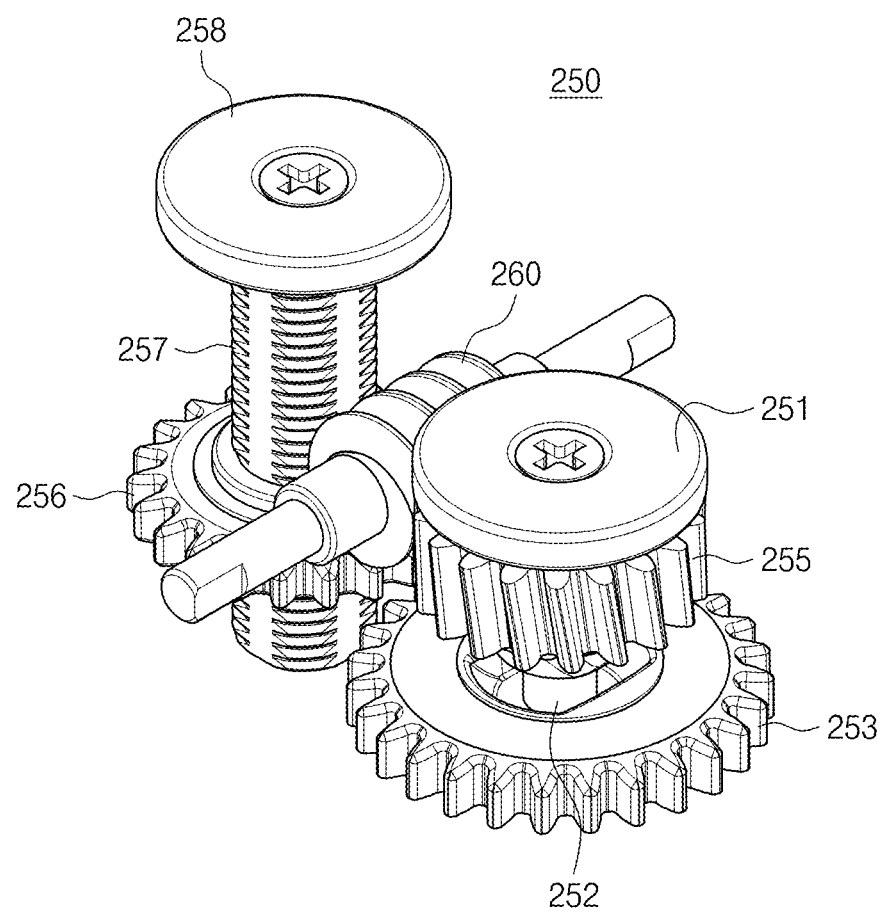
FIG. 6 is a perspective diagram illustrating an OFF state of a step difference adjusting unit of a display device according to an embodiment of the present disclosure.
Figure 7:
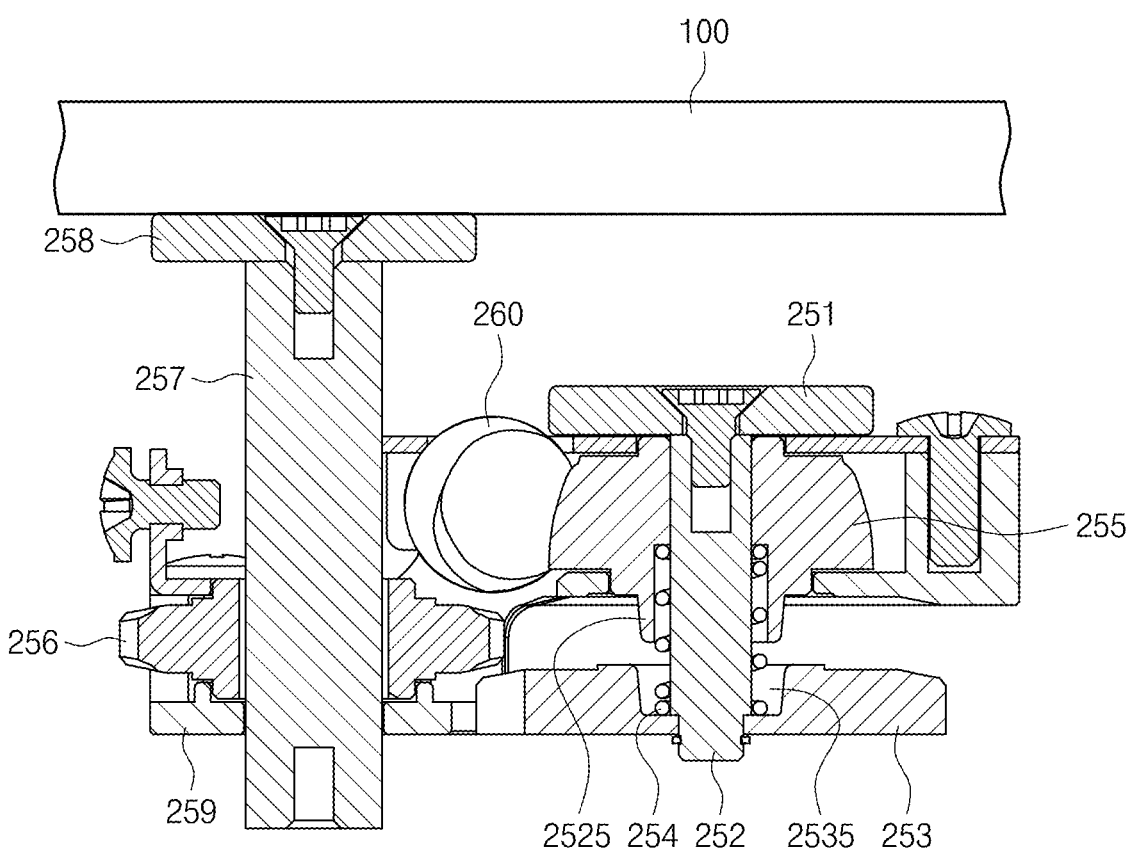
FIG. 7 is a cross-sectional diagram illustrating an OFF state of a step difference adjusting unit of a display device according to an embodiment of the present disclosure.

FIG. 6 is a perspective diagram illustrating an OFF state of the step difference adjusting unit 250 of the display device 1000 according to an embodiment of the present disclosure, and FIG. 7 is a cross-sectional diagram illustrating an OFF state of the step difference adjusting unit 250 of the display device 1000 according to an embodiment of the present disclosure.

Figure 8:
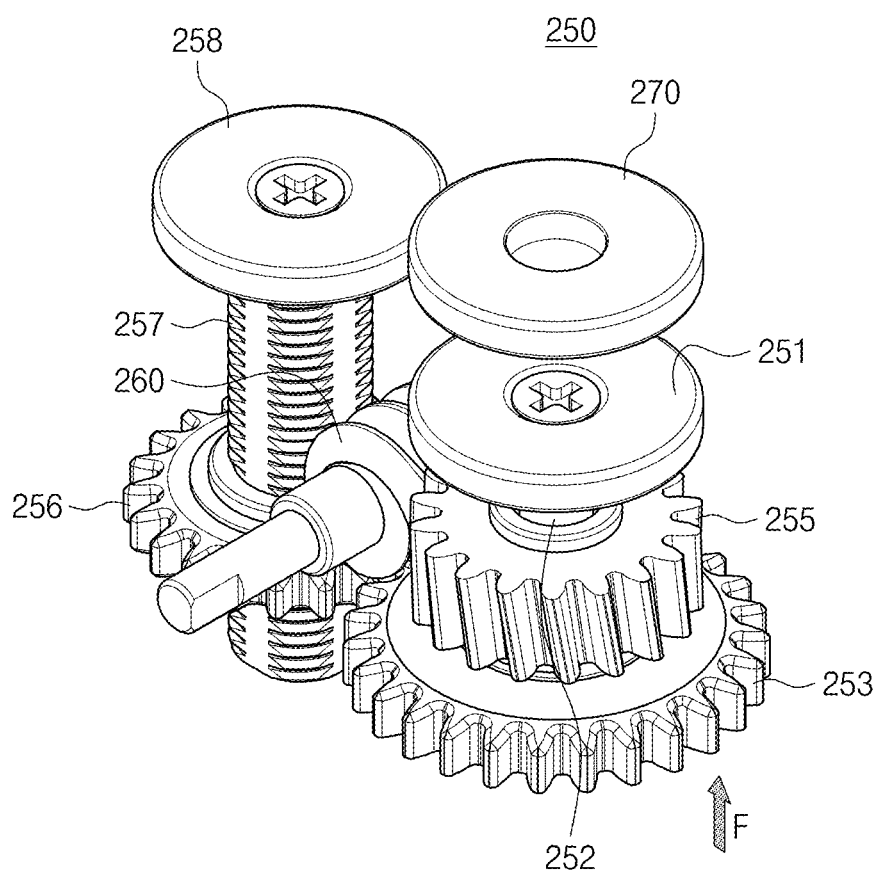
FIG. 8 is a perspective diagram illustrating an ON state of a step difference adjusting unit of a display device according to an embodiment of the present disclosure.
Figure 9:
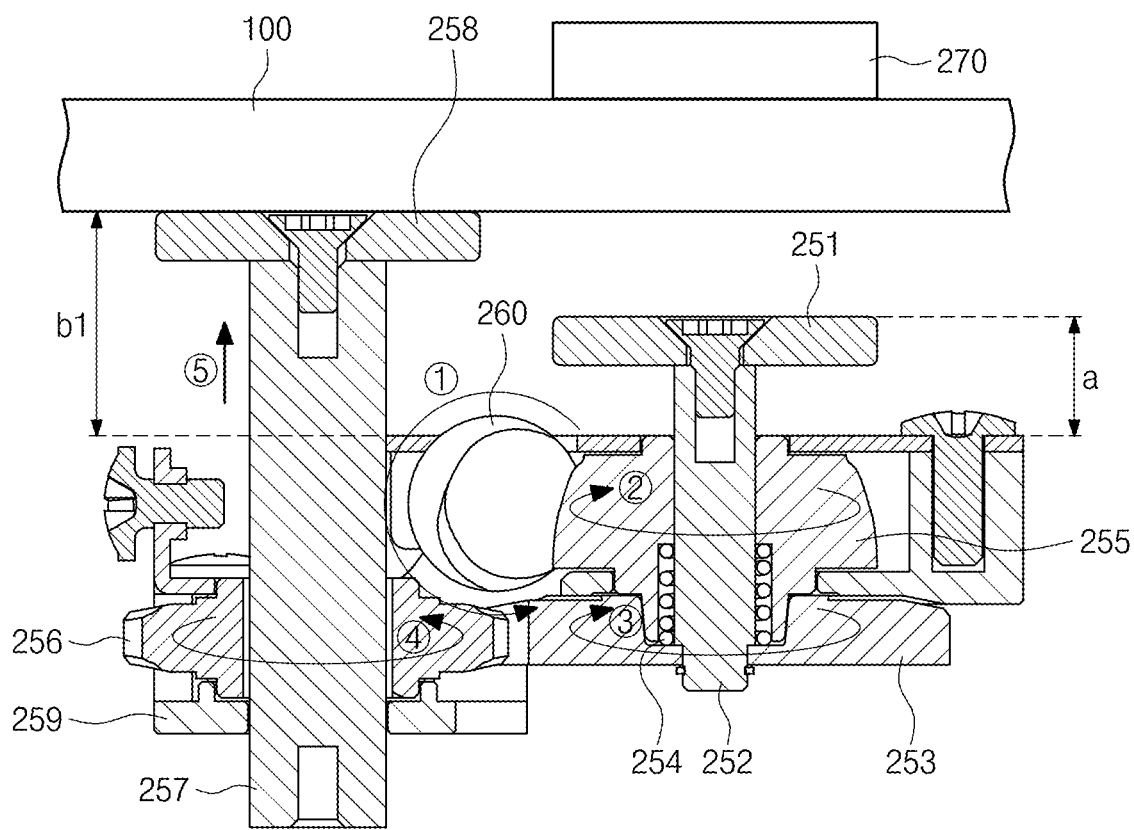
FIG. 9 is a cross-sectional diagram illustrating an ON state of a step difference adjusting unit of a display device according to an embodiment of the present disclosure.

FIG. 8 is a perspective diagram illustrating an ON state of the step difference adjusting unit 250 of the display device 1000 according to an embodiment of the present disclosure, and FIG. 9 is a cross-sectional diagram illustrating an ON state of the step difference adjusting unit 250 of the display device 1000 according to an embodiment of the present disclosure.

Referring to FIG. 7, a clutch module may include a worm wheel 255 rotating by being engaged with a worm shaft 260 and a clutch gear 253 transmitting a driving force of the worm wheel 255 to a leveling screw 257.

The clutch gear 253 may be coupled to a nut gear 256 while moving in a front-rear direction. When the clutch gear 253 moves to a position engaged with the teeth of the nut gear 256, the nut gear 256 may be rotated by receiving a rotational force of the worm wheel 255. In this case, in order to stably transmit the rotational force of the worm wheel 255, as shown in FIG. 9, the clutch gear 253 may move forward and be coupled to a rear surface of the worm wheel 255.

The clutch gear 253 moves forward and backward so as to be selectively fastened to the nut gear 256 and the worm wheel 255. The clutch gear 253 is spaced apart from the nut gear 256 and the worm wheel 255 in the OFF state.

In the present embodiment, the worm wheel 255 and the clutch gear 253 are disposed in the front-rear direction and may be disposed adjacent to each other so as to rotate by engaging with the teeth of the worm wheel 255. In the present embodiment, in the state in which the clutch module is in the ON state, the worm wheel 255, the clutch gear 253, and the nut gear 256 may be positioned at the same height in the front-rear direction and engaged with each other, thereby interoperating with each other.

A clutch shaft 252 and a clutch head 251 may be included to control the clutch gear 253 to move in the front-rear direction. A rear end of the clutch shaft 252 is coupled to the clutch gear 253, and the clutch head 251 is positioned at a front end of the clutch shaft 252.

The clutch head 251 includes a metal material attached to a magnet and may move forward when a magnetic force is applied from the front. When a magnet jig 270 including a magnet is positioned in front of a display module 100, the clutch head 251 may move toward the display module 100 by a magnetic force of the magnet jig 270.

The magnet of the magnet jig 270 may be a permanent magnet or an electromagnet that selectively generates a magnetic force when supplying power. In this case, even if the magnet jig 270 is not removed from the display module 100, the clutch module may be switched to the OFF state simply by turning off the power of the electromagnet.

Figure 10:
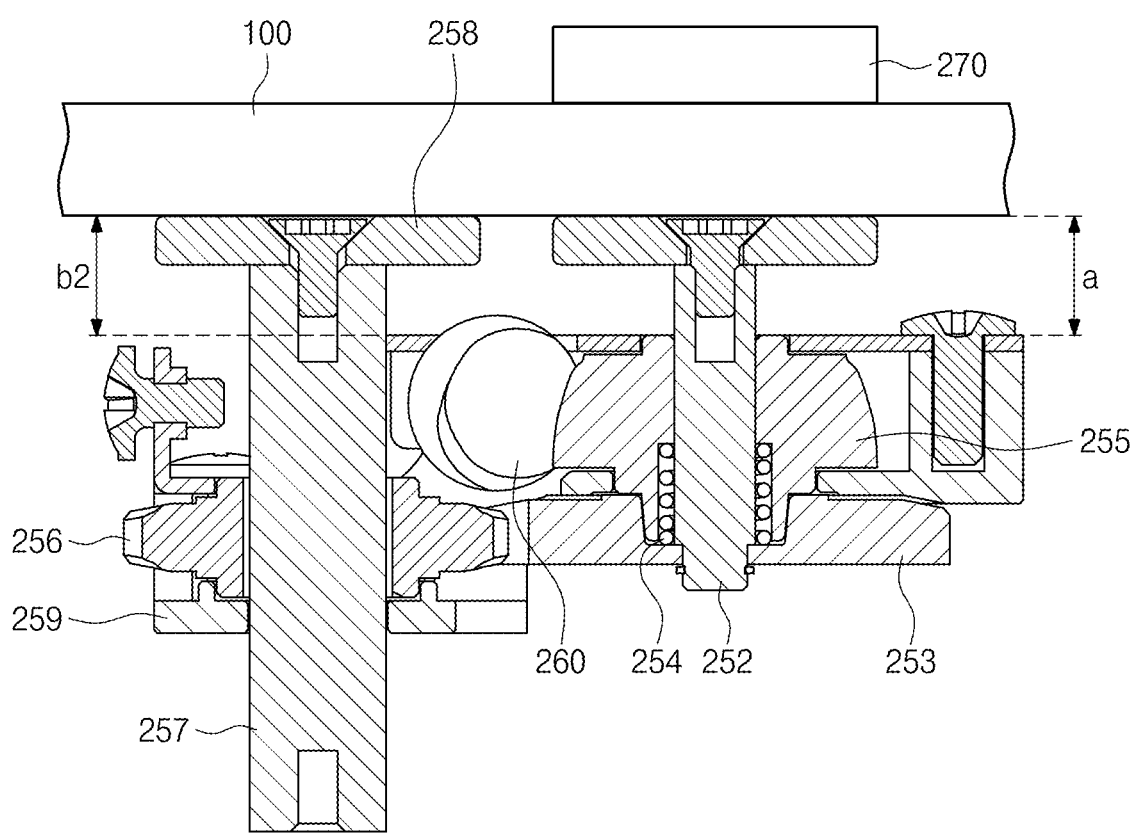
FIG. 10 is a cross-sectional diagram illustrating an ON state of a step difference adjusting unit of a display device according to another embodiment of the present disclosure.

FIG. 10 is a cross-sectional diagram illustrating an ON state of the step difference adjusting unit 250 of the display device 1000 according to another embodiment of the present disclosure, in which the leveling screw 257 is inserted into the nut gear 256 maximally and the leveling screw 257 is projected shortest from the frame 200.

If a position of the clutch head 251 is projected further forward than the holder magnet 258 while the clutch gear 253 is coupled to the nut gear 256, as shown in FIG. 10, the clutch gear 253 may not be coupled to the nut gear 256 while the leveling screw 257 is projected short.

When switching to an ON state in which the clutch gear 253 is coupled to the nut gear 256 irrespective of a length of the leveling screw 257, the clutch head 251 should enter an state of being in contact with the rear surface of the display module 100 as shown in FIG. 10 or not being in contact with the rear surface of the display module 100 as shown in FIG. 9.

That is, when the clutch module is switched from the OFF state to the ON state, a moving distance of the clutch gear 253 should be shorter than a distance between the rear surface of the display module 100 and the clutch head 251.

Accordingly, in the ON state in which the clutch gear 253 is coupled to the nut gear 256 as shown in FIG. 9 or FIG. 10, a projected amount a from the frame 200 of the clutch shaft 252 should be equal to or less than a projected amount b1 or b2 from the frame 200 of the leveling screw 257 (a≤b1 or b2). Hence, a moving distance a of the clutch module should be equal to or less than a minimum projected length b2 of the leveling screw 257 (a≤b2).

In order to stably receive a rotational force of the worm wheel 255 when the clutch gear 253 is coupled to the worm wheel 255 as shown in FIG. 9 and FIG. 10, a clutch protrusion 2525 protruding from a rear surface of the worm wheel 255 and a clutch recess 2535 formed in a front surface of the clutch gear 253 to be engaged with the clutch protrusion 2525 may be included. The clutch recess 2535 may be formed in the worm wheel 255 and the clutch protrusion 2525 may be formed at the clutch gear 253.

After the clutch recess 2535 and the clutch protrusion 2525 are coupled, they may include a straight line portion 2535a so that the clutch shaft 252 may rotate together when the worm wheel 255 rotates.

Figure 11:
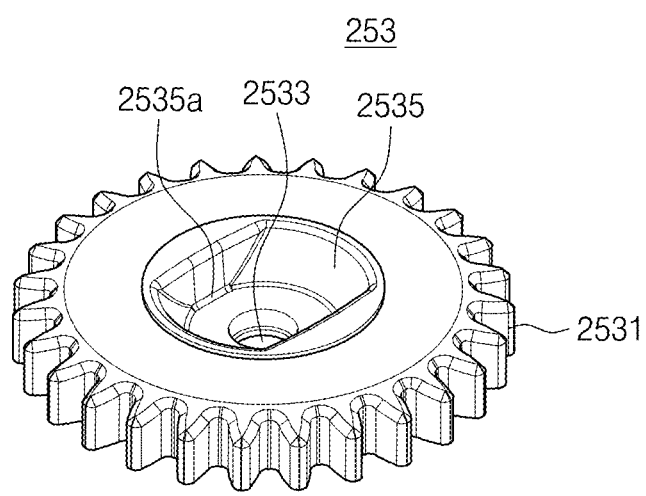
FIG. 11 is a front perspective diagram illustrating a clutch gear of a display device according to an embodiment of the present disclosure.

FIG. 11 is a front perspective view of the clutch gear 253 of the display device 1000 according to one embodiment of the present disclosure, and the clutch recess 2535 is illustrated. The clutch recess 2535 may have a polygonal shape or a shape formed to have a straight line partially in a circular shape.

A shape of the clutch recess 2535 is configured to be symmetrical to facilitate the worm wheel 253 to be coupled to the clutch gear 252 irrespective of the disposition of the worm wheel 255. The clutch recess 2535 of FIG. 11 is symmetrical to a 180° section, but the straight line portion 2535a may be disposed as a 90° section or a 60° section.

Since the clutch shaft 252 is fastened to the clutch recess 2535, a shaft hole 2533 to which the clutch shaft 252 is coupled may be formed in the clutch recess 2535. The clutch gear 253 is moved forward when the clutch head 251 is moved forward by the magnet jig 270, and the clutch protrusion 2525 of the worm wheel 255 is inserted into the clutch recess 2535 of the clutch gear 253. By receiving the rotational force of the worm wheel 255, the clutch gear 253 may be rotated, and the nut gear 256 may be rotated to move the leveling screw 257 in the front-rear direction.

The clutch shaft 252 may serve as a rotating shaft of the worm wheel 255 and the clutch gear 253, and may be fixed to both the clutch shaft 252 and the worm wheel 255 to rotate together, or may move only forward and backward without rotating.

When the clutch shaft 252 is fixed to both the worm wheel 255 and the clutch gear 253, the clutch shaft 252 may transmit the rotational force of the worm wheel 255 to the clutch gear when the worm wheel 255 is rotated. In this case, when the worm wheel 255 is rotated in the OFF state of the clutch module, both the clutch gear 253 and the clutch shaft 252 are rotated. Since the clutch gear 253 is not fastened to the nut gear 256, the leveling screw 257 is not moved.

However, in this case, since the driving force of the worm shaft 260 is unnecessarily consumed, the worm wheel 255 and the clutch shaft 252 may be configured not to rotate together but only the worm wheel 255 may be configured to rotate around the clutch shaft 252. Since the worm shaft 260 is not fixed to the worm wheel 255, the rotational force of the worm wheel 255 is not transmitted to other components in the OFF state.

As shown in FIG. 8, when the clutch gear 253 is fastened to the worm wheel 255, the teeth 2531 of the clutch gear 253 are engaged with the teeth of the nut gear 256 coupled with the leveling screw 257. Therefore, the rotation of the worm wheel 255 is transmitted to the nut gear 256 through the clutch gear 253.

After the display module 100 is moved by a desired amount, the magnet jig 270 may be spaced apart from a front surface of the display module 100 to stop the movement of the leveling screw 257.

When the magnet jig 270 is spaced apart from the display module 100, the clutch gear 253 of the clutch module is spaced apart from the worm wheel 255 and the clutch module is switched to the OFF state. In this case, a restoring spring 254 for pressing the clutch gear 253 in a rear direction may be further included to provide a force for the clutch gear 253 to be moved backward.

In the present embodiment, the restoring spring 254 may be positioned between the worm wheel 255 and the clutch gear 253, may be compressed in a state where the clutch gear 253 and the worm wheel 255 are coupled together as shown in FIG. 9, and may be tensioned in a state where they are spaced apart as shown in FIG. 7.

A magnetic force of the magnet jig 270 may provide a magnetic force greater than the elasticity of the restoring spring 254, so that the magnet jig 270 may move the clutch head 251 forward to compress the restoring spring 254.

The restoring spring 254 may not be coupled to at least one of the worm wheel 255 or the clutch gear 253. When another step difference adjusting unit 250 is driven, the worm wheel 255 of the step difference adjusting unit 250 in the OFF state rotates, and thus this is to prevent the rotational force of the worm wheel 255 from being transmitted to the clutch gear 253 through the restoring spring 254.

Figure 12:
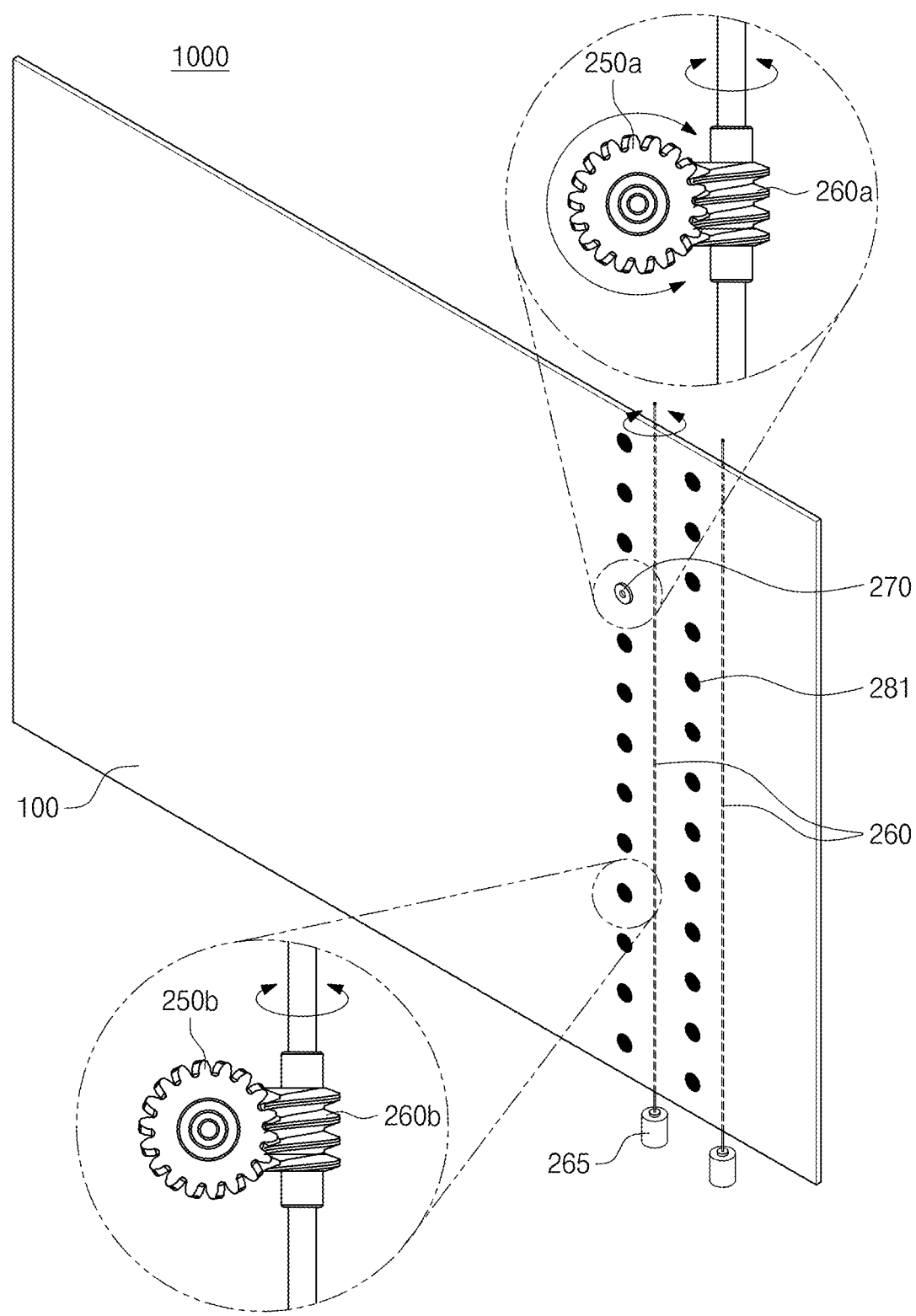
FIG. 12 is a schematic diagram illustrating a method of controlling a step difference adjusting unit of a display device according to an embodiment of the present disclosure.

FIG. 12 is a schematic diagram illustrating a method of controlling the step difference adjusting unit 250 of the display device 1000 according to an embodiment of the present disclosure. As described above, the worm shaft 260 may be elongated to control a plurality of the step difference adjusting units 250, and a plurality of the step difference adjusting units 250 may be disposed along a longitudinal direction of the worm shaft 260.

As only the step difference adjusting unit 250a that turned on the clutch module with the magnet jig 270 is synchronized with the worm shaft 260, the clutch gear 253 rotates to drive the leveling screw 257, and the rest of the step difference adjusting units 250b are not driven even if the worm shaft 260 rotates.

The display device 100 of the present disclosure may control the step difference adjusting unit 250 without separating the display module 100, but there is a problem that it is difficult for a user to find a position of the clutch head 251 of the step difference adjusting unit 250 in front of the display module 100.

Accordingly, the display device 1000 of the present disclosure outputs a marker 281 displaying the position of the clutch head 251 of the step difference adjusting unit 250 on a front surface of the display module 100 so that a user may easily recognize a contact position of the magnet jig 270.

A user may visually check a step difference between the neighboring display modules 100, contact the magnet jig 270 with the marker 281 corresponding to the step difference adjusting unit 250 where the step difference needs to be adjusted, and then rotate the worm shaft 260 to adjust the step difference.

The marker 281 may be displayed on a screen in white or color. When the display module 100 is brightly turned on for aging after installing the display module 100 on the frame 200, the marker 281 may be displayed in dark color on the screen of the display module 100.

Alternatively, the display device 1000 may further include a displacement sensor 240 that measures a step difference between neighboring display modules 100. As shown in FIG. 4, the displacement sensor 240 may measure a step difference between the display modules 100 by embedding an optical sensor such as an ultrasonic wave or a laser in a rear surface of the display module 100 or the frame 200.

Alternatively, since the displacement sensor 240 is no longer used after it is installed, a jig-shaped displacement sensor (not shown) that is installed in the front surface of the display module 100 may be used only when the display module 100 is installed in the frame 200.

Figure 13:
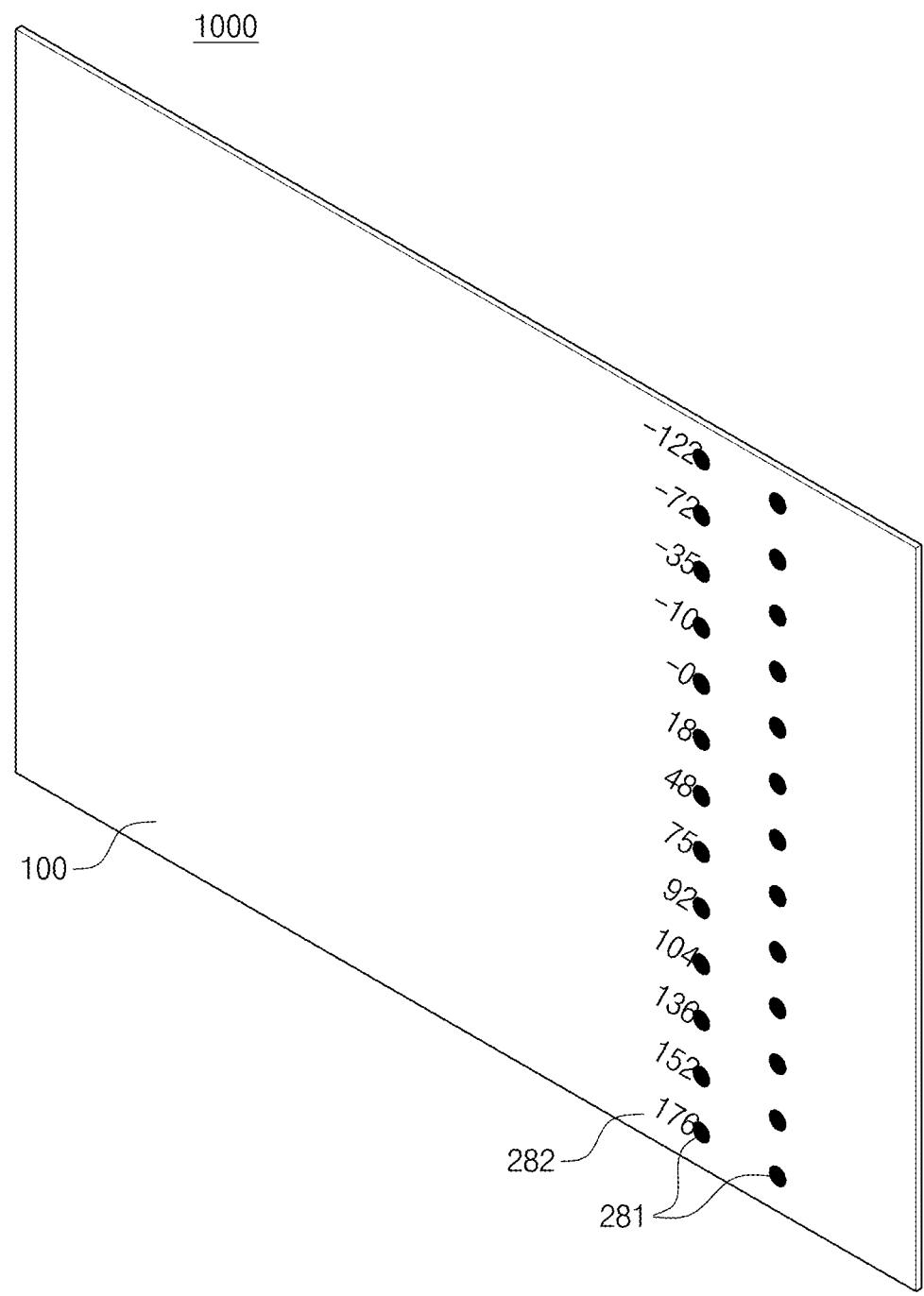
FIG. 13 and FIG. 14 are diagrams illustrating a state in which a marker for guiding control of a step difference adjusting unit of a display device according to the present disclosure is output.
Figure 14:
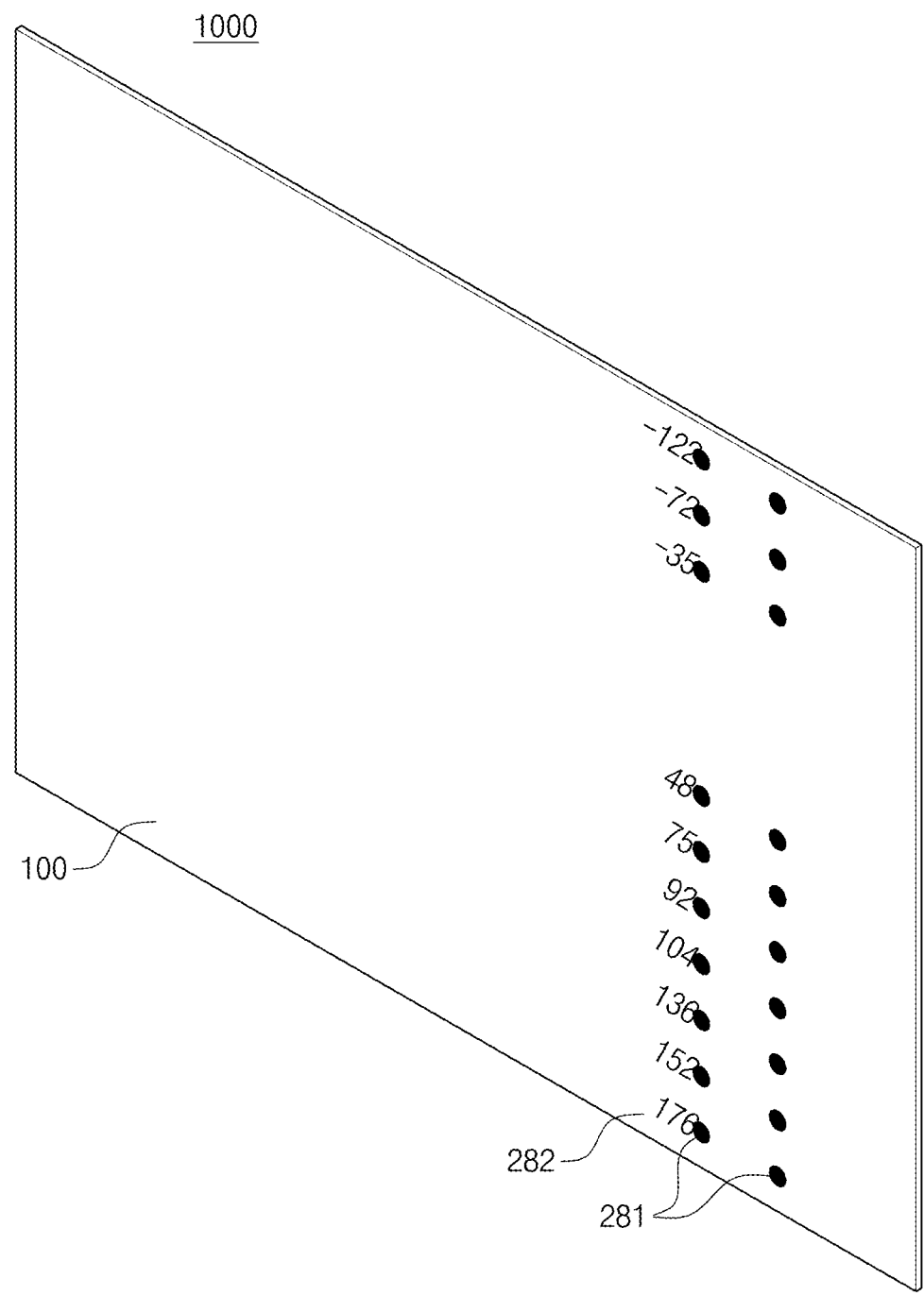

FIG. 13 and FIG. 14 are diagrams illustrating a state in which the marker 281 for guiding control of the step difference adjusting unit 250 of the display device 1000 according to the present disclosure is outputted.

As shown in FIG. 13, a controller 180 may output a value 282 measured by the displacement sensor 240 to the display module 100 and output the step difference adjusting unit 250 to be adjusted. The displacement sensor 240 may detect not only a step difference between the neighboring display modules 100 but also an inclination of the display module 100 and guide a single display module 100 to be installed while forming a plane.

All markers 281 are not always displayed. As shown in FIG. 14, the marker 281 corresponding to the adjustment-completed step difference adjusting unit 250 may be no longer outputted, or the marker 281 corresponding to the step adjustment unit 250 having the same height as the neighboring display module 100 and requiring no adjustment may not be outputted.

Figure 15:
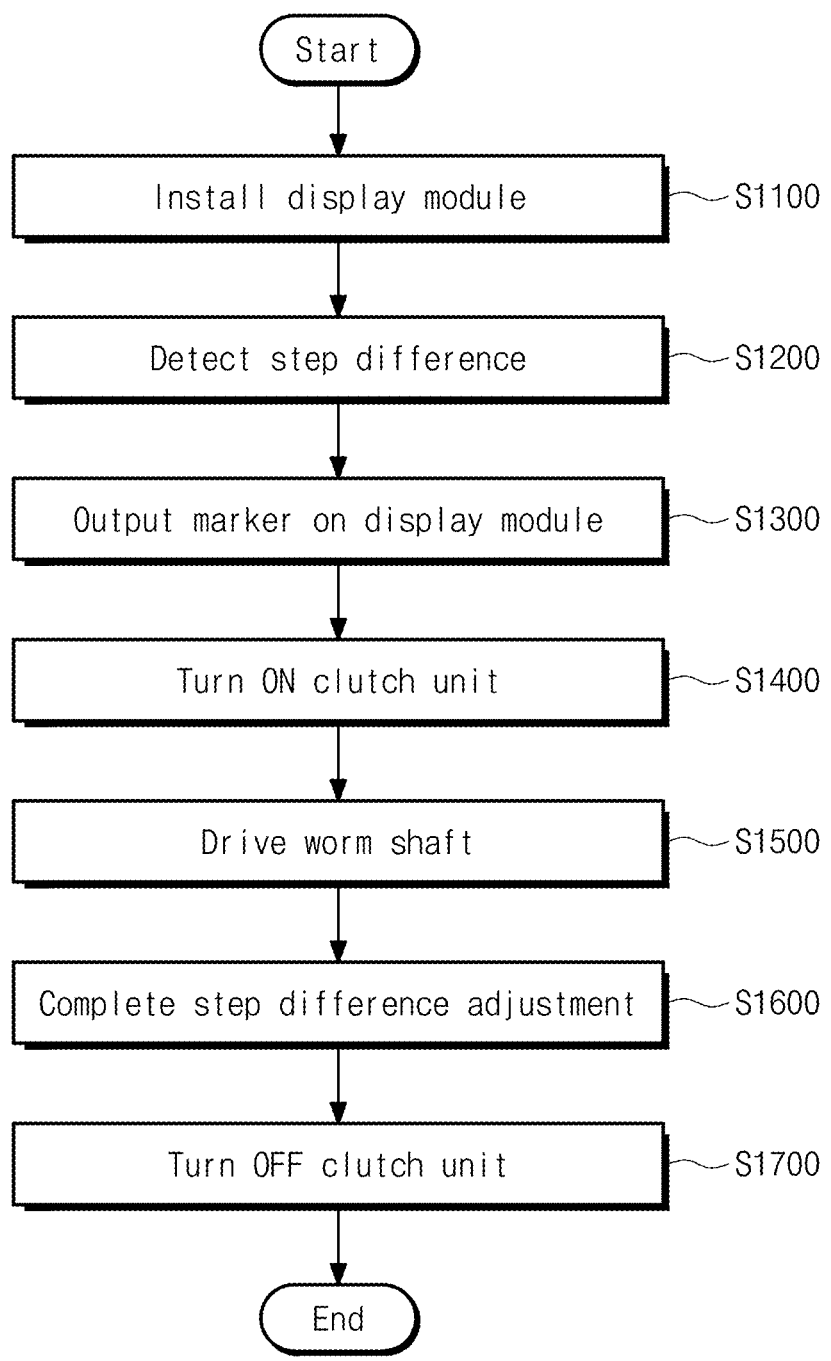
FIG. 15 is a flowchart illustrating a method of controlling a step difference adjusting unit of a display device according to an embodiment of the present disclosure.

FIG. 15 is a flowchart illustrating a method of controlling the step difference adjusting unit 250 of the display device 1000 according to an embodiment of the present disclosure. After the display module 100 is installed in the frame 200 (S1100), a step difference from a neighboring display module 100 may be sensed by using naked eyes or the displacement sensor 240 (S1200).

The controller may output the marker 281 indicating a position of the clutch head 251 of the step difference adjusting unit 250 on the display module 100 (S1300, see FIG. 13). In this case, an adjustment-required step difference detected by the displacement sensor 240 may be displayed numerically on the display module 100.

If the magnet jig 270 contacts the marker 281 at a step difference adjustment required position, the clutch unit of the corresponding step difference adjusting unit 250 is switched to the ON state (S1400, see FIG. 8). When the worm shaft 260 is driven (S1500), only the leveling screw 257 of the step difference adjusting unit 250 having the clutch unit switched to the ON state may be moved to adjust the step difference of the display module 100. When the step difference adjustment is completed by rotating the worm shaft 260 by a required movement amount (S1600), the clutch unit may be switched to the OFF state by spacing the magnet jig 270 apart from the display module 100 (S1700).

When it is necessary to adjust a plurality of the step difference adjusting units 250, the magnet jig 270 may be moved to another marker 281 and the steps S1400 to S1700 may be performed repeatedly.

As discussed above, according to an embodiment of the present disclosure, the installation time may be shortened by adjusting the height difference or the level difference between the display modules 100 disposed adjacent to each other without separation of the display module 100.

In addition, according to an embodiment of the present disclosure, it is possible to prevent an accident in which the display module 100 is damaged in a process of repeating attachment and detachment.

The above detailed description needs not be construed to be restrictive in any aspect and needs to be considered illustrative. The scope of the present disclosure needs to be determined by reasonable interpretation of the appended claims, and all changes within the equivalent scope of the present disclosure are included in the scope of the present disclosure.

What is claimed is:

1. A display device, comprising:
a display module;
a frame located at a rear of the display module;
a step difference adjuster located between the display module and the frame and configured to adjust a distance between the display module and the frame;
a worm shaft configured to provide a driving force to the step difference adjuster; and
a controller configured to cause the display module to output a marker at a position corresponding to the step difference adjuster.

2. The display device of claim 1, wherein the step difference adjuster is one of a plurality of step difference adjusters, and
wherein the controller is configured to cause the display module to output markers only for step difference adjusters requiring adjustment.

3. The display device of claim 1, wherein the step difference adjuster is one of a plurality of step difference adjusters, and
wherein the marker is not output for a step difference adjuster of the plurality of step difference adjusters not requiring step difference adjustment.

4. The display device of claim 1, wherein the display module is one of a plurality of display modules, and
further comprising a displacement sensor configured to measure a step difference between adjacent display modules of the plurality of display modules,
wherein the controller is configured to cause one or more of the plurality of display modules to output a value obtained via the displacement sensor.

5. The display device of claim 1, wherein the step difference adjuster comprises:
a holder magnet coupled to a rear surface of the display module;
a leveling screw extending rearward from the holder magnet and configured to be screw-coupled to the frame for adjusting the distance between the display module and the frame; and
a clutch module configured to provide the driving force of the worm shaft to the leveling screw based on the clutch module being in an engaged position,
wherein the clutch module is moveable to the engaged position based on application of a magnetic force.

6. The display device of claim 5, further comprising a nut gear having the leveling screw passing therethrough, wherein the driving force provided by the clutch module rotates the nut gear to move the leveling screw in a front-rear direction.

7. The display device of claim 5, further comprising:
a worm wheel engaged with the worm shaft,
wherein the clutch module comprises:
a clutch gear selectively coupled to the worm wheel to transmit the driving force from the worm wheel to the leveling screw;
a clutch shaft passing through the clutch gear; and
a clutch head located at a front of the clutch shaft,
wherein the marker is output by the display module to indicate a position of the clutch head.

8. The display device of claim 7, wherein the clutch gear is coupled to the worm wheel based on the application of the magnetic force for moving the clutch head.

9. The display device of claim 5, wherein the magnetic force is applied by an electromagnet configured to selectively provide the magnetic force, and
wherein power to the electromagnet is turned off based on the step difference adjuster no longer being operated.

10. The display device of claim 1, wherein the step difference adjuster is one of a plurality of step difference adjusters disposed to be spaced apart along a longitudinal direction of the worm shaft, and
wherein the worm shaft is engaged with a corresponding worm wheel of each of the plurality of the step difference adjusters.

11. A method of installing a display device, the method comprising:
mounting a plurality of display modules coupled to a frame;
detecting a step difference between adjacent display modules of the plurality of display modules;
displaying a marker on a display module of the adjacent display modules corresponding to a position of a step difference adjuster;
causing a magnetic force to be applied to a position of the displayed marker to cause a clutch module of the step difference adjuster to be engaged; and
adjusting a forward-backward position of the display module by rotating a worm shaft coupled to the step difference adjuster.

12. The method of claim 11, wherein the magnetic force is applied via a magnetic jig.

13. The method of claim 11, wherein the magnetic force is applied via operation of an electromagnet.

14. A display device, comprising:
a display module;
a frame located at a rear of the display module;
a step difference adjusting means located between the display module and the frame for adjusting a distance between the display module and the frame;
a worm shaft configured to provide a driving force to the step difference adjusting means; and
a controller configured to cause the display module to output a marker at a position corresponding to the step difference adjusting means.

15. The display device of claim 14, further comprising a clutch means configured to be moved between a disengaged position and an engaged position based on application of a magnetic force at the position of the marker to allow transmission of the driving force from the worm shaft to the step difference adjusting means for adjusting the distance between the display module and the frame.

* * * * *